United States Patent
Fleissner et al.

(10) Patent No.: US 10,177,202 B2
(45) Date of Patent: Jan. 8, 2019

(54) DOUBLE-SIDED EMISSIVE ORGANIC DISPLAY DEVICE AND METHOD FOR PRODUCING A DOUBLE-SIDED EMISSIVE ORGANIC DISPLAY DEVICE

(71) Applicant: OSRAM OLED GmbH, Regensburg (DE)

(72) Inventors: Arne Fleissner, Regensburg (DE); Simon Schicktanz, Regensburg (DE); Erwin Lang, Regensburg (DE); Nina Riegel, Tegernheim (DE); Egbert Hoefling, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/060,635

(22) Filed: Mar. 4, 2016

(65) Prior Publication Data

US 2016/0260791 A1 Sep. 8, 2016

(30) Foreign Application Priority Data

Mar. 4, 2015 (DE) .................. 10 2015 103 124

(51) Int. Cl.
*H01L 27/32* (2006.01)

(52) U.S. Cl.
CPC ...... *H01L 27/3216* (2013.01); *H01L 27/3213* (2013.01); *H01L 27/326* (2013.01);
(Continued)

(58) Field of Classification Search
CPC ....... H01L 2227/323; H01L 2251/5323; H01L 27/3213; H01L 27/3216; H01L 27/326; H01L 27/3262
(Continued)

(56) References Cited

U.S. PATENT DOCUMENTS

| 8,263,968 B2 * | 9/2012 | Kwok | ................. G09G 3/3216 257/40 |
| 8,681,140 B2 * | 3/2014 | Yamazaki | ............ G06F 3/1446 345/1.1 |

(Continued)

FOREIGN PATENT DOCUMENTS

WO 2014206026 A1 12/2014

OTHER PUBLICATIONS

German Search Report based on application No. 10 2015 103 124.8 (10 pages) dated Jul. 31, 2015.

*Primary Examiner* — Mohammed Shamsuzzaman
(74) *Attorney, Agent, or Firm* — Viering, Jentschura & Partner MBB

(57) ABSTRACT

A double-sided emissive organic display device includes a carrier, a control element layer structure above the carrier, a plurality of first organic light emitting components, which are formed above the carrier, which are electrically connected to the control element layer structure and which are driven by means of the control element layer structure during the operation of the double-sided emissive organic display device and emit first light substantially in a direction toward the carrier, and a plurality of second organic light emitting components, which are formed above the control element layer structure and which are electrically connected to the control element layer structure and which are driven by means of the control element layer structure during the operation of the double-sided emissive organic display device and emit second light substantially in a direction away from the carrier.

6 Claims, 6 Drawing Sheets

(52) U.S. Cl.
CPC .... *H01L 27/3262* (2013.01); *H01L 2227/323* (2013.01); *H01L 2251/5323* (2013.01)

(58) Field of Classification Search
USPC .................. 257/40, 202; 345/690, 211, 169; 313/506, 501, 504; 349/114, 69
See application file for complete search history.

(56) References Cited

U.S. PATENT DOCUMENTS

| | | | | |
|---|---|---|---|---|
| 9,041,280 | B2* | 5/2015 | Yan | H05B 33/22 313/504 |
| 9,230,510 | B1* | 1/2016 | Sivertsen | G09G 5/14 |
| 9,293,515 | B2* | 3/2016 | Choi | H01L 27/3267 |
| 2004/0227159 | A1* | 11/2004 | Nakashima | G09G 3/3225 257/202 |
| 2005/0024339 | A1* | 2/2005 | Yamazaki | G06F 1/1616 345/169 |
| 2005/0127820 | A1* | 6/2005 | Yamazaki | H01L 51/5281 313/501 |
| 2006/0066229 | A1* | 3/2006 | Nimura | H01L 27/3267 313/506 |
| 2007/0120478 | A1* | 5/2007 | Lee | H01L 25/048 313/512 |
| 2008/0036953 | A1* | 2/2008 | Otake | G02F 1/133555 349/114 |
| 2008/0303982 | A1* | 12/2008 | Jin | G02F 1/1335 349/69 |
| 2011/0148944 | A1* | 6/2011 | Kobayashi | G09G 3/3225 345/690 |
| 2014/0139458 | A1 | 5/2014 | Premutico et al. | |
| 2015/0194467 | A1 | 7/2015 | Zhang et al. | |
| 2015/0234496 | A1* | 8/2015 | Mizuhashi | G06F 3/044 345/174 |
| 2015/0295015 | A1* | 10/2015 | Yu | H01L 27/3251 257/88 |
| 2015/0370521 | A1* | 12/2015 | Yang | G06F 3/041 345/173 |
| 2016/0231837 | A1* | 8/2016 | Baek | G06F 3/044 |

* cited by examiner

<Prior Art>

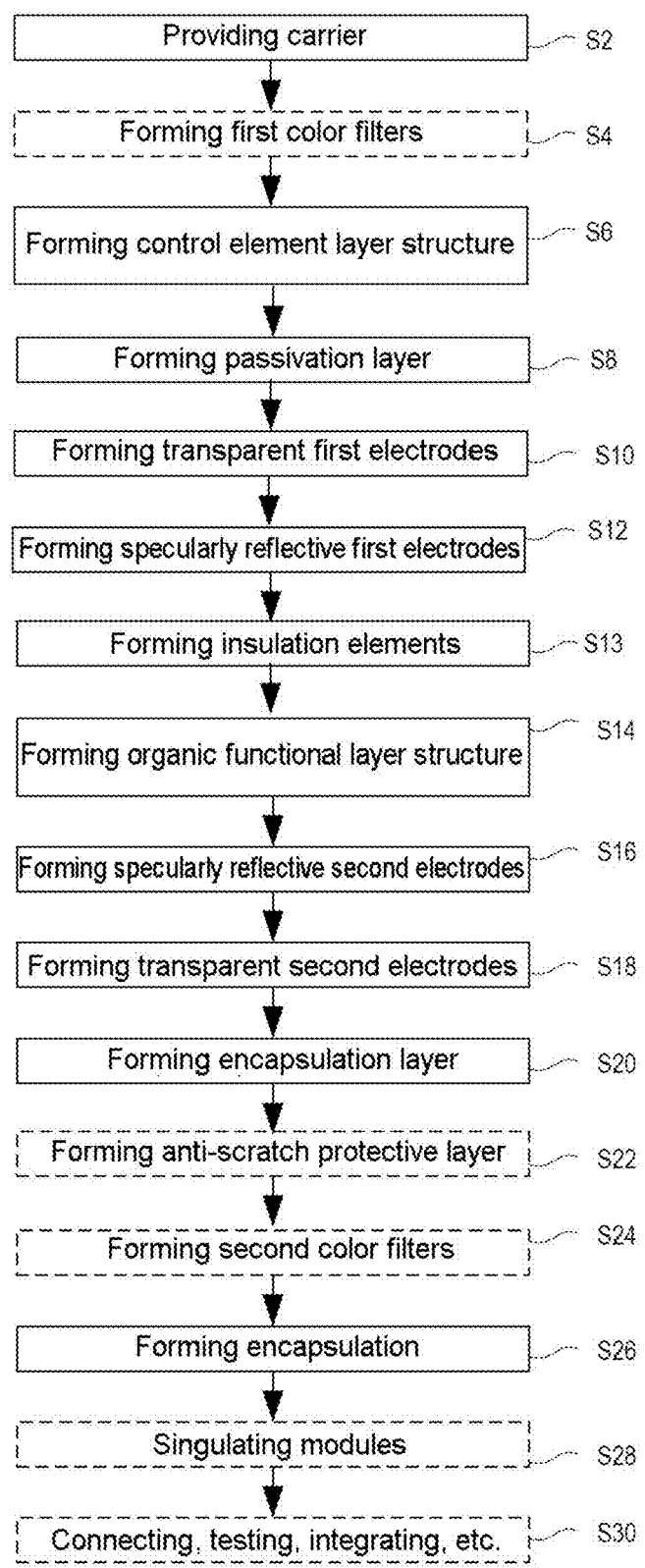

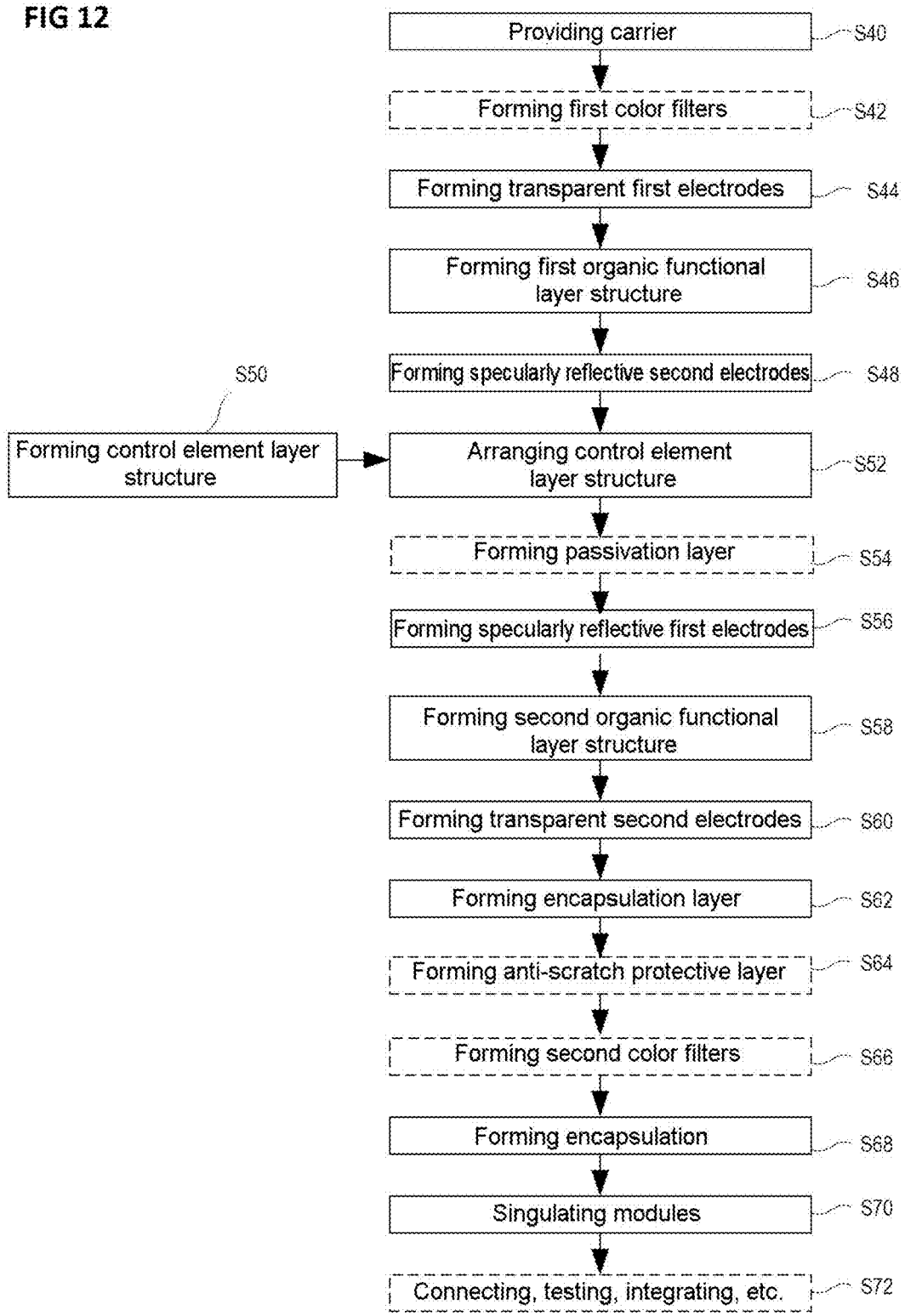

DOUBLE-SIDED EMISSIVE ORGANIC DISPLAY DEVICE AND METHOD FOR PRODUCING A DOUBLE-SIDED EMISSIVE ORGANIC DISPLAY DEVICE

CROSS-REFERENCE TO RELATED APPLICATION

This application claims priority to German Patent Application Ser. No. 10 2015 103 124.8, which was filed Mar. 4, 2015, and is incorporated herein by reference in its entirety.

TECHNICAL FIELD

Various embodiments relate generally to a double-sided emissive organic display device and to a method for producing a double-sided emissive organic display device.

BACKGROUND

Modern display devices often include pixels arranged in lines and columns. The number of pixels in the lines and columns determines the resolution of the display device. By way of example, 1920 pixels in the X-direction and 1080 pixels in the Y-direction, that is to say 1920×1080 pixels, are required for a Full HD resolution. The pixels often include in each case one, two, three or four subpixels. The subpixels are formed for example such that they emit red (r), green (g), blue (b) or white (w) light during operation depending on image data for representing an image, for example arranged in accordance with r,g,b, r,g,b,w or r,r,g,b or the like. As an alternative thereto, the subpixels can generate exclusively white light that is then converted into red, green or blue light by means of a respective color filter. In the case of the r,g,b, for example, a total of 3×X×Y individually drivable subpixels thus result. In the case of AM displays, the individual subpixels are driven individually by means of a control element layer structure, also referred to as a backplane, in particular as a TFT backplane.

Each pixel includes one, two or more subpixels and the electronic components for operating the subpixels. Each subpixel includes, for emitting the light, a light emitting component, for example an inorganic light emitting component (LED) or an organic light emitting component (OLED). Furthermore, each subpixel may include electronic components for operating the corresponding subpixel. As organic light emitting components, by way of example, use is made of bottom emitters, which emit the light generated by them on the substrate side, that is to say in the direction of their own substrate, or use is made of top emitters, which emit the light generated by them on the cover glass side, that is to say in the direction of their own cover glass. A display device including OLEDs can be referred to, for example, as an organic display device or as an organic display. The display device can be used for example as an optical display in a cellphone, a tablet PC, a laptop, a monitor or a television.

Particularly as monitors and televisions, double-sided emissive display devices are known, which can represent images and/or videos on their front side and on their rear side, such that two viewers with opposite viewing directions relative to one another, with the monitor or the television between them, can view the images and/or videos.

A conventional double-sided emissive display device can be provided, for example, by two single-sided emissive display devices that are fully adequate independently of one another being bonded together and/or held together by a frame back-to-back such that a representation of the desired content on both single-sided emissive display devices is possible. This is relatively complex and expensive since two completely independent display devices firstly have to be produced and then also have to be connected to one another. These double-sided emissive display devices include respectively two carriers, respectively two encapsulations and respectively two control element layer structures. Moreover, such double-sided emissive display devices are relatively thick since the thicknesses of the two single-sided emissive display devices are added. Such a double-sided emissive display device is formed neither substantially monolithically nor in a fully integrated fashion, since two substantially monolithic and fully integrated single-sided emissive display devices are connected to one another, whereby a multipartite and only partly integrated display device is provided.

In the case of double-sided emissive display devices which are viewed in principle only from one of the two sides at a time, use can be made of a passive matrix display, for example, in which either one side or the other can be driven individually. This can be used for example as a display device of a clamshell cellphone in which either the display can be viewed from outside in the closed state or the display can be viewed from inside in the flipped-open state.

Furthermore, transparent display devices are known in which the light emission of a pixel is effected in both emission directions, wherein the emission ratio of front to rear side can be set within certain limits. Double-sided emissive and/or transparent OLEDs can be used for transparent display devices. In such a display, the content on one side of the display is always represented in a laterally reversed manner, in particular not laterally correctly and/or in a mirror-inverted manner.

SUMMARY

A double-sided emissive organic display device includes a carrier, a control element layer structure above the carrier, a plurality of first organic light emitting components, which are formed above the carrier, which are electrically connected to the control element layer structure and which are driven by means of the control element layer structure during the operation of the double-sided emissive organic display device and emit first light substantially in a direction toward the carrier, and a plurality of second organic light emitting components, which are formed above the control element layer structure and which are electrically connected to the control element layer structure and which are driven by means of the control element layer structure during the operation of the double-sided emissive organic display device and emit second light substantially in a direction away from the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 11 shows a flow diagram of one embodiment of a method for producing a double-sided emissive display device; and FIG. 12 shows a flow diagram of one embodiment of a method for producing a double-sided emissive display device.

DESCRIPTION

Figure 1:
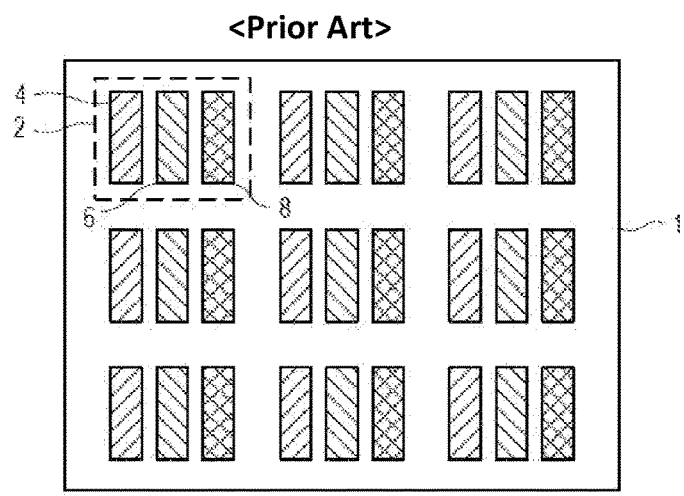
FIG. 1 shows a plan view of a conventional double-sided emissive organic display device.

The following detailed description refers to the accompanying drawings that show, by way of illustration, specific details and embodiments in which the invention may be practiced.

In the following detailed description, reference is made to the accompanying drawings, which form part of this description and show for illustration purposes specific embodiment s in which the invention can be implemented. Since component parts of embodiment s can be positioned in a number of different orientations, the direction terminology serves for illustration and is not restrictive in any way whatsoever. It goes without saying that other embodiment s can be used and structural or logical changes can be made, without departing from the scope of protection of the present invention. It goes without saying that the features of the various embodiment s described herein can be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, insofar as this is expedient.

A control element layer structure can also be referred to as a backplane. The control element layer structure may include a plurality of electrical and/or electronic components, for example electrical lines or electronic components. An electronic component may include for example an active and/or a passive component. An active electronic component may include for example a computing, control and/or regulating unit and/or a transistor. A passive electronic component may include for example a capacitor, a resistor, a diode or a coil.

An organic light emitting component can also be referred to as an OLED or, in this application, as a subpixel. An organic light emitting component includes, in principle, a first electrode, an organic functional layer structure above the first electrode and a second electrode above the organic functional layer structure. In the case of a top emitter OLED, that is to say in the case of a top emitting OLED, the second electrode is formed as transparent and the first electrode is formed as specularly reflective. In the case of a bottom emitter OLED, that is to say in the case of a bottom emitting OLED, the first electrode is formed as transparent and the second electrode is formed as specularly reflective.

Various embodiments provide a double-sided emissive organic display device which is thin, which can be produced simply and/or cost-effectively, in which an image and/or video content to be represented can be different on both sides and/or can be represented laterally correctly and/or which is substantially monolithic and/or fully integrated.

Various embodiments provide a method for producing a double-sided emissive organic display device which can be carried out simply and/or cost-effectively and/or which contributes to the double-sided emissive organic display device being thin, substantially monolithic and/or fully integrated, and/or to the fact that with the double-sided emissive organic display device an image and/or video content to be represented can be different on both sides and/or can be represented laterally correctly.

In accordance with various embodiments, a double-sided emissive organic display device is provided, including: a carrier; a control element layer structure above the carrier; a plurality of first organic light emitting components, which are formed above the carrier, which are electrically connected to the control element layer structure and which are driven by means of the control element layer structure during the operation of the display device and emit light substantially in a direction toward the carrier; and a plurality of second organic light emitting components, which are formed above the control element layer structure and which are electrically connected to the control element layer structure and which are driven by means of the control element layer structure during the operation of the display device and emit light substantially in a direction away from the carrier An encapsulation, e.g. an encapsulation layer and/or a covering body, can also be formed above the second organic light emitting components. The carrier of the display device serves as a carrier for the first and second organic light emitting components. The encapsulation of the display device serves as an encapsulation for the first and second organic light emitting components. The double-sided emissive organic display device includes only one carrier, only one control element layer structure and, if appropriate, only one encapsulation and is formed such that it is substantially monolithic and fully integrated.

The first organic light emitting components can also be referred to as bottom emitters. The second organic light emitting components can also be referred to as top emitters. With the aid of the bottom emitters, images and/or videos can be represented which can be recognized by a viewer looking from outside at the carrier, for example at the front side of the double-sided emissive organic display device. With the aid of the top emitters, images and/or videos can be represented which can be recognized by a viewer looking from outside at the encapsulation, for example at the rear side of the double-sided emissive organic display device. The top emitters can be driven independently of the bottom emitters, as a result of which the image and/or video contents can be represented independently of one another and laterally correctly on both sides of the double-sided emissive organic display device.

The fact that the first organic light emitting components emit the light substantially in a direction toward the carrier means, for example, that the first organic light emitting components are bottom emitters and/or that a significant proportion of the light generated by them is emitted in a direction toward the carrier, for example between 90% and 99.99%, for example between 95% and 99%; for example, the light generated by them is emitted exclusively in a direction toward the carrier. The fact that the second organic light emitting components emit the light substantially in a direction away from the carrier means, for example, that the second organic light emitting components are top emitters and/or that a significant proportion of the light generated by them is emitted in a direction away from the carrier, for example between 90% and 99.99%, for example between 95% and 99%; for example, the light generated by them is emitted explicitly in a direction away from the carrier.

The double-sided emissive organic display device does not require two single-sided emissive display devices arranged back-to-back. In contrast thereto, both display directions are integrated in a monolithic fully integrated double-sided emissive organic display device, as a result of which the production and material costs are particularly low. A single control element layer structure, that is to say a single backplane or backplane level, can be used for the electrical driving of the top and bottom emitters. Furthermore, a single substrate and a single encapsulation can be used, for which reason the production and material costs are particularly low. The double-sided emissive organic display device thus includes a combination of bottom and top emitters on a common backplane. The bottom and top emitters can be driven individually and independently of one another.

The control element layer structure includes a multiplicity of electrical and electronic components that are required for operating the organic light emitting components, e.g. electrical lines, resistors, transistors, diodes, capacitors and/or electrical insulators.

The double-sided emissive organic display device can be used for a variety of applications, for example for shop window displays, display panels, laptops, for example for representing important information content on one side and a logo representation on the other side, display indicators for automatic checkout machines, advertising surface displays, emergency exit signs, signage applications and many more.

The resolution can be identical or different for both display directions. In various embodiments, it is possible to form the same number of pixels including top emitters as the number of pixels including bottom emitters, or a different number of pixels including top emitters compared with the number including bottom emitters. Alternatively, the double-sided emissive display device can be formed as double-sided emissive only in a partial region of its active area. In other words, pixels including top emitters together with pixels including bottom emitters can be formed only in a partial region of the double-sided emissive organic display device. By way of example, the regions for bottom or top emission can be disjoint. By way of example, the pixel region of a region with bottom emission can surround, divide and/or separate a region with top emission. Furthermore, the bottom and top emitters and pixels formed by them can be arranged in different ways, as a result of which a variety of advantages arise and/or are intensified.

In accordance with one development, the first organic light emitting components are above the control element layer structure. This makes it possible to produce the double-sided emissive display device in a linear method in which firstly the carrier is provided and then all the other elements are formed successively above the carrier. In various embodiments, firstly the control element layer structure can be formed above the carrier, high temperatures possibly required being unproblematic, and subsequently, after the cooling of the control element layer structure, the temperature-sensitive organic light emitting components can be formed thereabove.

In accordance with one development, the first light emitting components and the second light emitting components are formed laterally alongside one another in such a way that they form a vertical overlap region. The vertical overlap region extends in a vertical direction. In other words, the first and second organic light emitting components are arranged at least partly one behind another in side view and overlap wholly or partly in side view. To put it in yet another way, the first and second organic light emitting components can be formed for example in a common light emitting layer structure, individual layer or plane. To put it in yet another way, the first organic light emitting components are not offset with respect to the second organic light emitting components in a vertical direction, or at least not to an extent such that a separating plane extending in a lateral direction fits therebetween, said separating plane separating the first organic light emitting components from the second light emitting components. This can contribute for example to the fact that the organic functional layer structures of the first and second organic light emitting components can be formed in only one work step or in work steps that proceed directly successively. In various embodiments, this makes it possible to form only a single organic functional layer structure for the first and second organic light emitting components.

In accordance with one development, the first light emitting components, that is to say the bottom emitters, are formed in a manner offset with respect to the second light emitting components, that is to say the top emitters, in a vertical direction. To put it another way, the first organic light emitting components and the second organic light emitting components are formed laterally alongside one another in such a way that they do not form a vertical overlap region. To put it in yet another way, the first and second organic light emitting components are arranged one below another in side view and do not overlap in side view. To put it in yet another way, the first and second organic light emitting components can be formed for example in two different light emitting layer structures or planes that do not overlap vertically. This makes it possible to use different organic functional layer structures for the first organic light emitting components compared with those for the second organic light emitting components.

In accordance with one development, the first organic light emitting components are formed in a vertical direction between the carrier and the control element layer structure. The control element layer structure is thus arranged above the bottom emitters and below the top emitters and separates the layers forming the bottom emitters from the layers forming the top emitters. This makes it possible to be able to dispense with transparent materials in the case of the control element layer structure, since neither the top emitters nor the bottom emitters emit the light generated by them toward the outside through the control element layer structure. The light emitting pixels or their subpixels in the top and bottom directions are thus arranged such that topologically the bottom emitting pixels or subpixels are arranged in a first pixel plane below the backplane level and the top emitting pixels or subpixels are arranged in a second pixel plane above the backplane level. In this case, the backplane level lies between the pixel planes.

In order to avoid a situation in which the lower first pixel plane having the temperature-sensitive organic functional layer structures of the first organic light emitting components, that is to say the bottom emitters, is damaged by the subsequent processing of the control element layer structure, that is to say the backplane level, as might be the case for example if a silicon-based backplane were produced on a temperature-sensitive OLED pixel plane, the backplane or backplane level can be applied by means of a transfer process, for example. As an alternative thereto, the control element layer structure, that is to say the backplane, can be fabricated on the basis of semiconductors that can be processed at low temperatures. Organic semiconductors or oxidic semiconductors, for example ZnO, IZO, or IGZO, are appropriate for the latter case.

In accordance with one development, the control element layer structure has a lattice shape. The lattice shape has intersecting rows and columns extending in a lateral direction and cutouts bounded by the rows and columns. The first light emitting components and/or the second light emitting components are formed in the cutouts. To put it another way, the control element layer structure is formed in a lattice-shaped fashion in plan view and the light emitting components are arranged in the cutouts of the lattice shape. In this way, the control element layer structure and the organic light emitting components can form a vertical overlap region and/or be formed in a common plane. This can contribute to the fact that the organic display device can be made particularly thin.

In accordance with one development, the control element layer structure includes a single control element layer. To put it another way, all elements of the control element layer structure are arranged in the one layer and/or in one plane. This can contribute to the fact that the control element layer structure can be produced particularly simply.

In accordance with one development, the control element layer structure includes two or more control element layers formed directly one above another. To put it another way, the control element layer structure is constructed in a multilayered fashion, wherein none of the organic light emitting components is formed between the control element layers.

In accordance with one development, first pixels are formed by in each case at least two adjacent first organic light emitting components, and second pixels are formed by in each case at least two adjacent second organic light emitting components. The first pixels are thus bottom emitter pixels and the second pixels are top emitter pixels. By way of example, in the case of an r,g,b pixel, three organic light emitting components form the corresponding pixel and, in the case of an r,g,b,w pixel, four organic light emitting components form the corresponding pixel. The fact that the organic light emitting components are adjacent means, in the case of the first organic light emitting components, that they are the first light emitting components closest to one another in a lateral direction, for example in the line direction, and, in the case of the second organic light emitting components, that they are the second organic light emitting components closest to one another in a lateral direction, for example in the line direction. Consequently, a second light emitting component can thus be formed for example in a lateral direction between two adjacent first organic light emitting components.

In accordance with one development, the first pixels are formed in a manner offset with respect to the second pixels in a lateral direction such that the first pixels and the second pixels do not form a lateral overlap region. Consequently, the first and second pixels are arranged laterally alongside one another in plan view and do not overlap. In various embodiments, the first organic light emitting components do not form a lateral overlap region with the second organic light emitting components. None of the second organic light emitting components is arranged between the first organic light emitting components of one of the pixels in a lateral direction. None of the first light emitting components is arranged between the second organic light emitting components of one of the pixels in a lateral direction. The bottom and top emitter pixels are thus arranged in a manner laterally separated from one another and alternately, i.e. always a bottom emitter pixel alongside a top emitter pixel. The subpixels of each pixel are arranged laterally directly adjacently to one another.

In accordance with one development, the first pixels and the second pixels are formed such that they form a lateral overlap region. The lateral overlap region extends in a lateral direction. By way of example, the bottom and top emitter pixels are arranged one directly above another wholly or partly in a vertical direction. To put it another way, in plan view the first pixels are arranged fully or partly behind the second pixels. This can contribute to a particularly high fill factor, the ratio of active area to inactive area.

In accordance with one development, the first organic light emitting components of one of the first pixels are formed in a manner offset with respect to the second organic light emitting components of one of the second pixels, which overlaps the corresponding first pixel, in a lateral direction in such a way that they do not form a lateral overlap region with the first organic light emitting components of the corresponding first pixel and that one of the first organic light emitting components and then one of the second organic light emitting components are formed alternatively in a lateral direction. Consequently, the subpixels of the top and bottom emitter pixels are arranged alongside one another and in a manner separated from one another in a lateral direction; for example, in the line direction a top emitting red subpixel, that is to say a second organic light emitting component that emits red light, is arranged directly alongside a bottom emitting red subpixel, that is to say a second organic light emitting component that emits red light, in a lateral direction and is spaced apart therefrom. The same can also apply to the subpixels that emit green light and/or to the subpixels that emit blue light. This means that the bottom emitter pixels and top emitter pixels are interleaved in one another. Optionally, the top and/or bottom emitting subpixels can be formed line by line or column by column in the same configuration, i.e. all as top emitters or as bottom emitters. To put it another way, exclusively first organic light emitting components or exclusively second organic light emitting components can be formed for example in a column of subpixels.

In accordance with one development, the first organic light emitting components of one of the first pixels are formed in a manner offset with respect to the second organic light emitting components of one of the second pixels, which forms a lateral overlap region with the corresponding first pixel in a lateral direction in such a way that in each case one of the first organic light emitting components of the corresponding first pixel forms a lateral overlap region with one of the second organic light emitting components of the corresponding second pixel. To put it another way, the subpixels of top and bottom emitter pixels are not arranged in a manner spaced apart from one another in a lateral direction and at least partly overlap. To put it in yet another way, in plan view for example the second organic light emitting components are arranged partly behind a respective first organic light emitting component. This can be achieved by virtue of the fact that in the topological construction the first and second organic light emitting components are arranged in different light emitting planes, the pixel planes. Optionally, the top and bottom emitting subpixels can be formed line by line or column by column in the same configuration, i.e. as top emitters or as bottom emitters. To put it another way, exclusively first organic light emitting components or exclusively second organic light emitting components can be formed for example in a column of subpixels. The organic light emitting components can overlap completely, that is to say can be formed completely one behind another in plan view, or they can overlap only partly, such that in plan view at least one part of each second organic light emitting component protrudes behind the corresponding first organic light emitting component.

In accordance with one development, the individual first organic light emitting components in each case have a different size than the individual second organic light emitting components in a lateral direction. By way of example, the first organic light emitting components have a smaller active area than the second organic light emitting components. As an alternative thereto, the second organic light emitting components have a smaller active area than the first organic light emitting components.

In accordance with one development, the control element layer structure includes a plurality of sense lines and a plurality of signal lines, which intersect one another and which are electrically connected to the first organic light emitting components and to the second organic light emitting components for the purpose of driving the pixels. The sense lines or the signal lines are electrically connected in each case to a plurality of the first organic light emitting components and to a plurality of the second organic light emitting components, such that the first organic light emitting components and second organic light emitting components connected to one of the sense lines or to one of the signal lines are drivable by means of the same corresponding sense line or signal line. This can contribute to the fact that the control element layer structure can be formed particularly simply, for example since, in comparison with a conventional double-sided emissive display device including two single-sided emissive display devices back-to-back, only one signal line is formed for each column of first and second subpixels or only one sense line is formed for each line of first and second subpixels.

Various embodiments provide a method for producing an organic display device. In the method, a carrier is provided. A control element layer structure is formed above the carrier. A plurality of first organic light emitting components are formed above the carrier. The first organic light emitting components are driven by means of the control element layer structure during the operation of the display device and emit light exclusively in a direction toward the carrier. The first organic light emitting components are electrically connected to the control element layer structure. A plurality of second organic light emitting components are formed above the control element layer structure and are electrically connected to the control element layer structure. The second organic light emitting components are driven by means of the control element layer structure during the operation of the organic display device and emit light exclusively in a direction away from the carrier.

In accordance with one development, the first organic light emitting components are formed above the control element layer structure. If the control element layer structure is arranged between the carrier and the first organic light emitting components, then firstly the control element layer structure is formed above the carrier and subsequently the organic light emitting components are formed above the control element layer structure.

In accordance with one development, the control element layer structure is formed above the first organic light emitting components. If the first organic light emitting components are formed between the carrier and the control element layer structure, then firstly the first organic light emitting components are formed above the carrier. In a parallel method, the control element layer structure can be formed and then arranged above the first organic light emitting components and be electrically and mechanically connected thereto.

FIG. 1 shows a plan view of a conventional double-sided emissive organic display device 1, e.g. of a partial region of the conventional double-sided emissive organic display device 1, for example of a module of the conventional double-sided emissive organic display device 1. The conventional double-sided emissive organic display device 1 can be composed for example of a plurality of such modules arranged laterally alongside one another.

The conventional double-sided emissive organic display device 1 includes a plurality of pixels 2; for example, the module illustrated includes three lines and three columns of pixels 2, that is to say nine pixels. As an alternative thereto, the module of the conventional double-sided emissive organic display device 1 may include more or fewer pixels 2.

Each pixel 2 includes three subpixels, in particular one subpixel that emits red light, which is also referred to as a red subpixel, one subpixel that emits green light, which is also referred to as a green subpixel and one subpixel that emits blue light, which is also referred to as a blue subpixel. As an alternative thereto, each pixel may include only one, two or more than three, for example four, subpixels, for example additionally a subpixel that emits white light, which is also referred to as a white subpixel, or two red subpixels, one green subpixel and one blue subpixel.

The red subpixels each include a conventional organic light emitting component 4 which emits red light during operation and which can also be referred to as a red OLED 4. The green subpixels each include a conventional organic light emitting component 6 which emits green light during operation and which can also be referred to as a green OLED 6. The blue subpixels each include a conventional organic light emitting component 8 which emits blue light during operation and which can also be referred to as a blue OLED 8.

The pixels 2 are arranged laterally alongside one another and in a manner spaced apart from one another. In addition, the organic light emitting components 4, 6, 8 of the subpixels are arranged laterally alongside one another and in a manner spaced apart from one another.

FIG. 1 shows a front side of the conventional double-sided emissive organic display device 1, which is formed by a conventional first single-sided emissive organic display device. A rear side (not illustrated in the figures) of the conventional double-sided emissive organic display device 1 is formed by a conventional second single-sided emissive organic display device, which is fixedly connected back-to-back to the conventional first single-sided emissive organic display device. The pixels and/or subpixels (not illustrated) of the second single-sided emissive organic display device 1 can be arranged wholly or partly behind the pixels 2 in plan view, such that they form a respective lateral overlap region with the pixels 2.

Each of the conventional single-sided emissive organic display devices includes a dedicated carrier, a dedicated control element layer structure and a dedicated encapsulation including, for example, a dedicated encapsulation layer and/or a dedicated covering body. Consequently, the conventional double-sided emissive organic display device includes two carriers, two encapsulations and two control element layer structures.

With the aid of the conventional double-sided emissive organic display device, images and/or videos can be represented on the front side independently of images and/or videos that are represented on the rear side. Both on the front side and on the rear side the images and/or videos can be represented laterally correctly, that is to say for example not in a mirror-inverted manner.

Figure 2:
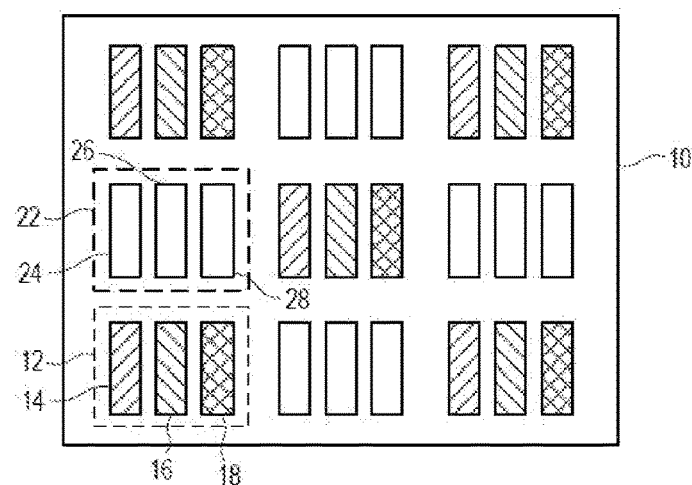
FIG. 2 shows a plan view of one embodiment of a double-sided emissive organic display device.

FIG. 2 shows a plan view of one embodiment of a double-sided emissive organic display device 10, e.g. of a partial region of the double-sided emissive organic display device 10, for example of a module of the double-sided emissive organic display device 10. The double-sided emissive organic display device 10 can be composed for example of a plurality of such modules arranged laterally alongside one another.

The double-sided emissive organic display device 10 includes a plurality of pixels 12, 22; for example, the module illustrated includes three lines and three columns of pixels 12, 22, that is to say nine pixels. As an alternative thereto, a module of the double-sided emissive organic display device 10 may include more or fewer pixels. The pixels include first pixels 12 and second pixels 22. The first pixels 12 are top emitting pixels or top emitter pixels and, with reference to FIG. 2, during operation emit light substantially in a direction out of the plane of the drawing. The second pixels 22 are bottom emitting pixels or bottom emitter pixels and, with reference to FIG. 2, during operation emit light substantially in a direction into the plane of the drawing. The second pixels 22 are illustrated as white in FIG. 2 since no images and/or videos can be represented and/or recognized with their aid from the front side shown.

The first pixels 12 are formed alongside and at a distance from the second pixels 22 in a lateral direction, specifically both in the line direction and in the column direction. Consequently, a second pixel 22 is always formed between two first pixels 12 in a lateral direction. The first pixels 12 do not form a lateral overlap region with the second pixels 22 in plan view.

Each pixel 12, 22 includes three subpixels. In particular, each first pixel includes one first subpixel that emits red light, which is also referred to as a first red subpixel, one first subpixel that emits green light, which is also referred to as a first green subpixel, and one first subpixel that emits blue light which is also referred to as a first blue subpixel. As an alternative thereto, each first pixel may include only one, two or more than three, for example four, first subpixels, for example additionally a first subpixel that emits white light, which is also referred to as a first white subpixel, or two first red subpixels, one first green subpixel and one first blue subpixel.

The first subpixels of each first pixel 12 are formed alongside one another and at a distance from one another in a lateral direction, specifically in the line direction. Consequently, no second subpixel is formed between the first subpixels of one of the first pixels 12. The second subpixels of each second pixel 22 are formed alongside one another and at a distance from one another in a lateral direction, specifically in the line direction. Consequently, no first subpixel is formed between the second subpixels of one of the second pixels 22.

The first red subpixels each include a first organic light emitting component 14 which emits red light during operation and which can also be referred to as a first red OLED 14. The first green subpixels each include a first organic light emitting component 16 which emits green light during operation and which can also be referred to as a first green OLED 16. The blue subpixels each include a first organic light emitting component 18 which emits blue light during operation and which can also be referred to as a first blue OLED 18.

In addition, each second pixel 22 includes one second subpixel that emits red light, which can also be referred to as a second red subpixel, one second subpixel that emits green light, which is also referred to as a second green subpixel, and one second subpixel that emits blue light, which is also referred to as a second blue subpixel. As an alternative thereto, each second pixel 22 may include only one, two or more than three, for example four, subpixels, for example additionally a subpixel that emits white light, which is also referred to as a white subpixel, or two red subpixels, one green subpixel and one blue subpixel.

The second red subpixels each include a second organic light emitting component 24 which emits red light during operation and which can also be referred to as a second red OLED 24. The second green subpixels each include a second organic light emitting component 26 which emits green light during operation and which can also be referred to as a second green OLED 26. The blue subpixels each include a second organic light emitting component which emits blue light during operation and which can also be referred to as a second blue OLED 28.

The first OLEDs 14, 16, 18 of each first pixel 12 are formed alongside one another and at a distance from one another in a lateral direction, specifically in the line direction. Consequently, no second OLED 24, 26, 28 is formed between the first OLEDs 14, 16, 18 of one of the first pixels 12. The second OLEDs 24, 26, 28 of each second pixel 22 are formed alongside one another and at a distance from one another in a lateral direction, specifically in the line direction. Consequently, no first OLED 14, 16, 18 is formed between the second OLEDs 24, 26, 28 of one of the second pixels 22. The pixels 12, 22 and/or the corresponding subpixels may include electronic components for operating the OLEDs 14, 16, 18, 24, 26, 28 in addition to the OLEDs 14, 16, 18, 24, 26, 28.

FIG. 2 shows a front side of the double-sided emissive organic display device 10, from which only the first pixels 12 and e.g. the light of the first organic light emitting components 14, 16, 18 can be discerned during the operation of the double-sided emissive organic display device 10. From a rear side (not illustrated in the figures) of the double-sided emissive organic display device 10, only the second pixels 22 and in particular the light of the second organic light emitting components 24, 26, 28 can be discerned during the operation of the double-sided emissive organic display device 10.

The double-sided emissive organic display device 10 includes a single carrier, a single control element layer structure and a single encapsulation, including for example a single encapsulation layer and/or a single covering body.

With the aid of the double-sided emissive organic display device 10, images and/or videos can be represented on the front side independently of images and/or videos that are represented on the rear side. Both on the front side and on the rear side the images and/or videos can be represented laterally correctly. The double-sided emissive organic display device 10 is formed monolithically and in a fully integrated fashion.

Alternatively, the subpixels of the pixels 12, 22 can be arranged laterally alongside one another in each case in the column direction.

In the illustrated plan views of the front sides of the double-sided emissive display devices 10 which are illustrated in the figures concerning this description, the second pixels 22 and the subpixels thereof are depicted in order to afford a better understanding. In actual fact, however, the double-sided emissive display devices 10 can be formed such that the second pixels 22 and the subpixels thereof are visible and/or discernible exclusively from the rear side of the double-sided emissive organic display devices 10.

Figure 3:
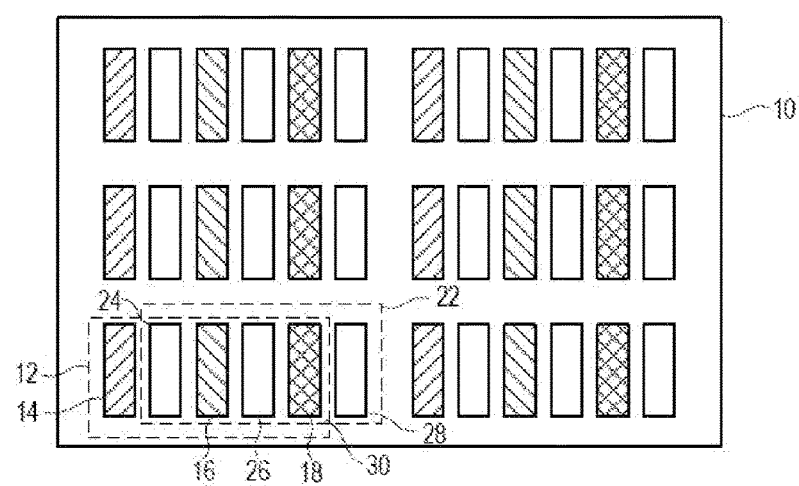
FIG. 3 shows a plan view of one embodiment of a double-sided emissive organic display device.

FIG. 3 shows a plan view of one embodiment of a double-sided emissive organic display device 10 which is formed largely in accordance with the double-sided emissive organic display device 10 illustrated in FIG. 2. In contrast thereto, however, the first pixels 12 and the second pixels 22 form in each case a lateral overlap region 30. To put it another way, the second pixels 22 lie at least partly behind the first pixels 12 in plan view. To put it in yet another way, the first and the second pixels 12, 22 are interleaved in one another in plan view. The lateral overlap region 30 extends in a lateral direction. The lateral direction is parallel to the plane of the drawing and parallel to the front side and the rear side of the double-sided emissive organic display device 10.

The first subpixels of the first pixels 22 are arranged laterally alongside one another and at a distance from one another in the line direction in such a way that a second subpixel of the second pixels 22 is always formed between two first subpixels in a lateral direction, without the first subpixels and the second subpixels overlapping one another in plan view. In various embodiments, the OLEDs 14, 16, 18 of the first pixels 22 are arranged laterally alongside one another and at a distance from one another in the line direction in such a way that a second OLED 24, 26, 28 of the second pixels 22 is always formed between two first OLEDs 14, 16, 18, without the first OLEDs 14, 16, 18 and the second OLEDs 24, 26, 28 overlapping one another in plan view.

The OLEDs 14, 16, 18, 24, 26, 28 arranged one above another in one of the columns can be operated by means of a common first or second electrode assigned to the corresponding column.

Figure 4:
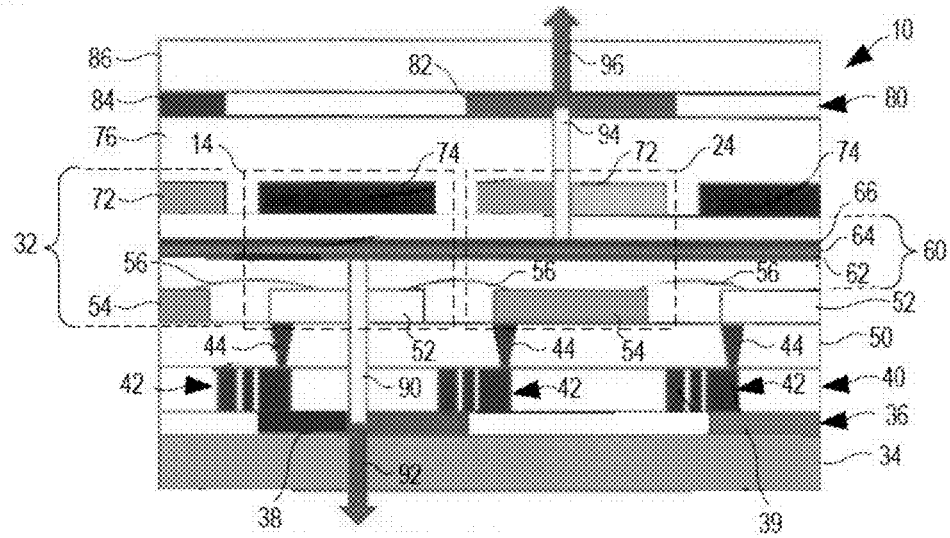
FIG. 4 shows a sectional illustration of one embodiment of the double-sided emissive organic display device in accordance with FIG. 3.

FIG. 4 shows a sectional illustration of one embodiment of the double-sided emissive organic display device in accordance with FIG. 3. In various embodiments, FIG. 4 shows merely a small excerpt from the double-sided emissive organic display device 10, e.g. from the module, in which only one of the first red OLEDs 14 and one of the second red OLEDs 24 are illustrated completely. However, the construction of the other OLEDs substantially corresponds to the construction of the OLEDs illustrated, for which reason the following description can readily be applied to the other OLEDs.

The double-sided emissive organic display device 10 includes a carrier 34. The carrier 34 is formed as transparent. The carrier 34 serves as a carrier element for electronic elements or layers, for example light emitting elements. The carrier 34 may include or be formed from plastic, glass, quartz and/or a semiconductor material, for example. Furthermore, the carrier 34 may include or be formed from a plastics film or a laminate including one or a plurality of plastics films. The carrier 34 can be formed as mechanically rigid or mechanically flexible.

A first color filter layer 36, which can also be referred to as a first color filter plane, is formed above the carrier 34. The first color filter layer 36 includes a plurality of first color filters, in particular one red first color filter 38 and one green first color filter 39 and one blue first color filter (not illustrated). The red first color filter 38 transmits red light 92, that is to say light in the red wavelength range, in a direction toward the carrier 34 and otherwise blocks light. The green first color filter 39 transmits green light, that is to say light in the green wavelength range, in a direction toward the carrier 34 and otherwise blocks light. The blue first color filter transmits blue light, that is to say light in the blue wavelength range, in a direction toward the carrier 34 and otherwise blocks light.

A control element layer structure 40, that is to say a backplane, is formed above the first color filter layer 36. The control element layer structure 40 includes a plurality of electrical and/or electronic components 42 which are electrically connected to the OLEDs 14, 16, 18, 24, 26, 28 and to one, two or more data, driver and/or control units (not illustrated) of the double-sided emissive organic display device 10. The electronic components 42 serve for operating, in particular for driving and/or regulating, the OLEDs 14, 16, 18, 24, 26, 28 and thus the subpixels and pixels 12, 22.

A planarization layer 50 is optionally formed above the control element layer structure 40. The planarization layer 50 includes, if appropriate, a plurality of first plated-through holes 44, by means of which first electrodes 52, 54 of the OLEDs 14, 16, 18, 24, 26, 28 are electrically connected to the control element layer structure 40. The planarization layer 50 can serve, for example, for electrically insulating the first electrodes 52, 54 from the control element layer structure 40 and/or for providing a planar surface for forming the OLEDs 14, 16, 18, 24, 26, 28 during production.

The first electrodes 52, 54 are formed above the control element layer structure 40 and, if appropriate, above the planarization layer 50. The first electrodes 52, 54 are parts of the OLEDs 14, 16, 18, 24, 26, 28. The first electrodes 52, 54 can also be referred to as bottom electrodes with regard to their positions in the figures. The first electrodes 52, 54 include transparent first electrodes 52 and specularly reflective first electrodes 54. The transparent first electrodes 52 are assigned to the first OLEDs 14, 16, 18, that is to say to the bottom emitting OLEDs, and the specularly reflective first electrodes 54 are assigned to the second OLEDs 24, 26, 28, that is to say to the top emitting OLEDs.

Electrical insulation elements 56 are in each case formed in a lateral direction between the first electrodes 52, 54, said electrical insulation elements including electrically insulating material, for example polyimide, epoxy resin adhesive, poly(methyl methacrylate) (PMMA), poly(methyl glutarimide) (PMGI), phenol formaldehyde, SU-8 from MicroChem as a specific example of a bisphenol-A epoxy resin, benzocyclobutene (BCB) or spin-on glass, e.g. on the basis of methylsiloxane.

An organic functional layer structure 60 is formed above the first electrodes 52, 54 and the insulation elements 56. The organic functional layer structure 60 extends over a plurality, for example over all of the OLEDs 14, 16, 18, 24, 26, 28, for example over a plurality, for example over all, of the pixels 12, 14 of the module or even of the organic display device 10. As an alternative thereto, a plurality of organic functional layer structure 60 separated from one another can be formed laterally alongside one another, said organic functional layer structures being assigned to one, two or more of the OLEDs 14, 16, 18, 24, 26, 28 or of the pixels 12, 22. By way of example, a continuous organic functional layer structure 60 extends over all of the first OLEDs 14, 16, 18 of the first pixel 12. The organic functional layer structure 60 includes a plurality of partial layers. In various embodiments, the organic functional layer structure 60 may include a hole injection layer, a hole transport layer, a first emitter layer 62, a second emitter layer 64, a third emitter layer 66, an electron transport layer and/or an electron injection layer. The hole injection layer serves for reducing the band gap between first electrode and hole transport layer. In the hole transport layer, the hole conductivity is greater than the electron conductivity. The hole transport layer serves for transporting the holes. In the electron transport layer, the electron conductivity is greater than the hole conductivity. The electron transport layer serves for transporting the electrons. The electron injection layer serves for reducing the band gap between second electrode and electron transport layer.

The second emitter layer 64 is arranged above the first emitter layer 62 and the third emitter layer 66 is arranged above the second emitter layer 64. The first emitter layer 62 emits red light, for example, during operation. The second emitter layer 64 emits green light, for example, during operation. The third emitter layer 66 emits blue light, for example, during operation.

Second electrodes 72, 74 are formed above the organic functional layer structure 60. The second electrodes 72, 74 are parts of the OLEDs 14, 16, 18, 24, 26, 28. The second electrodes 72, 74 can also be referred to as top electrodes with regard to their positions in the figures. The second electrodes 72, 74 include transparent second electrodes 72 and specularly reflective second electrodes 74. The transparent second electrodes 72 are assigned to the second OLEDs 24, 26, 28, that is to say to the top emitting OLEDs, and the specularly reflective second electrodes 74 are assigned to the first OLEDs 14, 16, 18, that is to say to the bottom emitting OLEDs.

The transparent first and second electrodes 52, 72 include a transparent and/or semitransparent electrically conductive material, for example a metal and/or a transparent conductive oxide (TCO) or a layer stack of a plurality of layers including metals or TCOs. The transparent first and second electrodes 52, 72 may include for example in each case a layer stack of a combination of a layer of a metal on a layer of a TCO, or vice versa. One example is a silver layer applied on an indium tin oxide layer (ITO) (Ag on ITO) or ITO-Ag-ITO multilayers. Alternatively, the transparent first and/or second electrodes 52, 72 can be formed in each case by a thin Ag or AgMg layer. The specularly reflective first and second electrodes 54, 74 include an electrically conductive nontransparent specularly reflective material including, for example, one, two or more metals having a particularly high electrical conductivity, for example silver and/or aluminum. The particularly high electrical conductivity can contribute to the fact that only a small number of plated-through holes 44, 98 (see FIG. 5) is required in order to provide a sufficient power supply for the OLEDs 14, 16, 18, 24, 26, 28. The electrodes 52, 54, 72, 74 may include as an alternative or in addition to the materials mentioned: networks composed of metallic nanowires and nanoparticles, for example composed of Ag, networks composed of carbon nanotubes, graphene particles and graphene layers and/or networks composed of semiconductor nanowires.

An encapsulation layer 76 is formed above the second electrodes 72, 74 and above the organic functional layer structure 60. The encapsulation layer 76 can be formed as a barrier layer, for example as a barrier thin-film layer. The encapsulation layer 76 can also be referred to as thin-film encapsulation. The encapsulation layer 76 forms a barrier against chemical contaminants or atmospheric substances, e.g. against water (moisture) and oxygen. The encapsulation layer 76 can be formed as an individual layer, a layer stack or a layer structure. The encapsulation layer 76 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, silicon carbide, poly(p-phenylene terephthalamide), nylon 66, and mixtures and alloys thereof.

A second color filter layer 80, which can also be referred to as a second color filter plane, is formed above the encapsulation layer 76. The second color filter layer 80 includes a plurality of second color filters, e.g. one red second color filter 82 and one blue second color filter 84 and one green second color filter (not illustrated). The red second color filter 82 transmits red light 96, that is to say light in the red wavelength range, in a direction away from the carrier 34 and otherwise blocks light. The blue second color filter 84 transmits blue light, that is to say light in the blue wavelength range, in a direction away from the carrier 34 and otherwise blocks light. The green second color filter transmits green light, that is to say light in the green wavelength range, in a direction away from the carrier 34 and otherwise blocks light.

A covering body 86 is formed above the second color filter layer 80. The covering body 86 can be fixed to the second color filter layer 80 by means of an adhesion medium layer (not illustrated), for example. The adhesion medium layer includes for example an adhesion medium, for example an adhesive, for example a lamination adhesive, a lacquer and/or a resin. The covering body 86 includes or is formed from plastic and/or glass, for example. The covering body 86 serves for protecting the double-sided emissive organic display device 10, for example against mechanical force actions from outside.

Each of the first OLEDs 14, 16, 18, for example the first red OLED 14, includes one of the transparent first electrodes 52 and one of the specularly reflective second electrodes 74 and, formed therebetween, a partial region of the organic functional layer structure 60. Each of the second OLEDs 24, 26, 28, for example the second red OLED 24, includes one of the specularly reflective first electrodes 54 and one of the transparent second electrodes 72 and, formed therebetween, a partial region of the organic functional layer structure 60. The OLEDs 14, 16, 18, 24, 26, 28 are arranged alongside one another in a lateral direction in such a way that they form a vertical overlap region 32 extending in a vertical direction. To put it another way, the OLEDs 14, 16, 18, 24, 26, 28 are arranged at least partly one behind another in the side view, such that they at least partly overlap in side view.

During the operation of the double-sided emissive organic display device 10, by means of the control element layer structure 40, a suitable voltage can be applied to the transparent first electrode 52 and the specularly reflective second electrode 74 of the first red OLED 14, for example. In response thereto, the partial region of the organic functional layer structure 60 of the first red OLED 14 firstly emits white light since the red, green and blue light of the emitter layers 62, 64, 66 mixes to form white light. The white light is firstly emitted in directions toward the carrier 34 and in a direction away from the carrier 34, that is to say in a direction toward the covering body 86. On account of the specularly reflective second electrode 74, however, that proportion of the white light which has emitted toward the covering body 86 is reflected in a direction toward the carrier 34, such that only white light 90 is emitted from the first red OLED 14 in the direction toward the carrier 34. Said white light 90 in a direction toward the carrier 34 impinges on the first red color filter 38, which transmits only the first red light 92 further in a direction toward the carrier 34 and out of the carrier 34. In this context, it should be noted that the first red color filter 38 may or may not be regarded as part of the first red OLED 14. In various embodiments, alternatively the second red color filter 38 can be formed above the control element layer structure 40, such that the control element layer structure 40 is not arranged between the transparent first electrode 52 and the first red color filter 38.

During the operation of the double-sided emissive organic display device 10, by means of the control element layer structure 40, a suitable voltage can be applied to the transparent second electrode 72 and the specularly reflective first electrode 54 of the second red OLED 24, for example. In response thereto, the partial region of the organic functional layer structure 60 of the second red OLED 24 firstly emits white light since the red, green and blue light of the emitter layers 62, 64, 66 mixes to form white light. The white light is firstly emitted in directions toward the carrier 34 and in a direction away from the carrier 34, that is to say in a direction toward the covering body 86. On account of the specularly reflective first electrode 54, however, that proportion of the white light which has emitted toward the carrier 34 is reflected in a direction toward the covering body 86, such that only white light 94 is emitted from the second red OLED 24 in the direction toward the covering body 86. Said white light 94 in a direction toward the covering body 86 impinges on the second red color filter 82, which transmits only second red light 92 further in a direction toward the covering body 86 and out of the covering body 86 and blocks the rest of the white light 94 toward the covering body 86. In this context, it should be noted that the second red color filter 82 may or may not be regarded as part of the second red OLED 24.

FIG. 4 does not illustrate second plated-through holes 98 (see FIG. 5) for electrically contacting the second electrodes 72, 74, since they are not visible in the corresponding sectional plane illustrated. However, the second plated-through holes 98 are illustrated in FIG. 5, explained below, and their embodiment can be applied to the double-sided emissive organic display device 10 illustrated in FIG. 4.

The embodiments and modes of functioning of the double-sided emissive organic display device 10 illustrated with reference to the red OLEDs 14, 24 can readily be applied to the blue and green OLEDs 16, 18, 26, 28.

Figure 5:
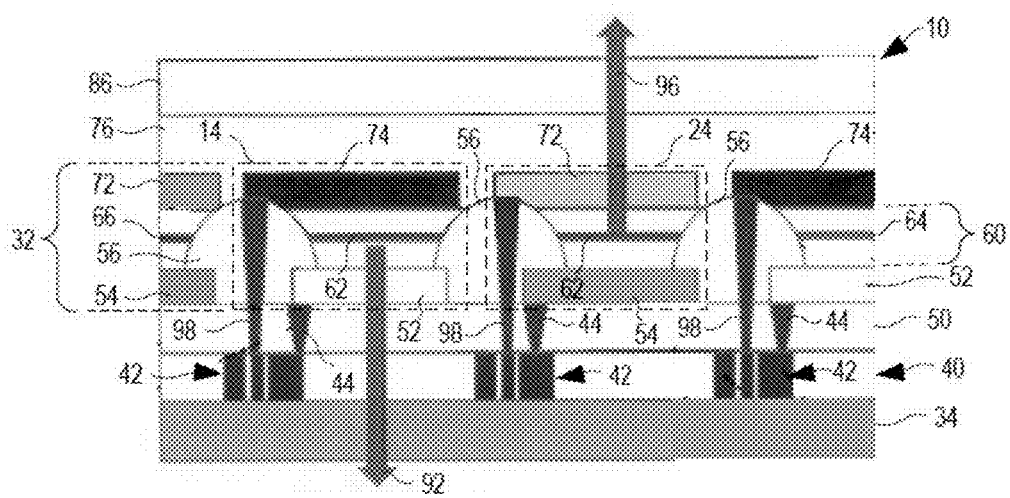
FIG. 5 shows a sectional illustration of one embodiment of the double-sided emissive organic display device in accordance with FIG. 3.

FIG. 5 shows a sectional illustration of one embodiment of the double-sided emissive organic display device 10 in accordance with FIG. 3, which can for example largely correspond to the double-sided emissive organic display device 10 explained with reference to FIG. 4. The double-sided emissive organic display device 10 includes no color filter layers 36, 80 and no corresponding color filters 38, 39, 82, 84. Each of the OLEDs 14, 16, 18, 24, 26, 28 includes its own organic functional layer structure 60 separate from the organic functional layer structures 60 of the adjacent OLEDs 14, 16, 18, 24, 26, 28. Each of the organic functional layer structures 60 includes only one emitter layer 62, 64, 66 and generates light of only one color.

In particular, the first red OLED 14 and the second red OLED 24 include only one first emitter layer 62 in each case, which emit red light during operation. The first and second green or blue OLEDs 16, 18, 26, 28 accordingly each include only one second emitter layer 64, which emits green light, for example, during operation, or one third emitter layer 66, which emits blue light, for example, during operation.

The second electrodes 72, 74 are electrically connected to the control element layer structure 40 via second plated-through holes 98. Said second plated-through holes are also present in the double-sided emissive organic display device 10 shown in FIG. 4, but they are not illustrated in FIG. 4 since the organic display device 10 in FIG. 4 is cut along a different sectional line than the double-sided emissive organic display device 10 shown in FIG. 5.

During the operation of the double-sided emissive organic display device 10, by means of the control element layer structure 40, a suitable voltage can be applied to the transparent first electrode 52 and the specularly reflective second electrode 74 of the first red OLED 14, for example. In response thereto, the organic functional layer structure 60, e.g. the first emitter layer 62, of the first red OLED 14 emits red light. The red light is emitted firstly in directions toward the carrier 34 and in a direction away from the carrier 34, that is to say in a direction toward the covering body 86. On account of the specularly reflective second electrode 74, however, that proportion of the red light which is emitted toward the covering body 86 is reflected in a direction toward the carrier 34, such that only red light 92 is emitted from the first red OLED 14 in a direction toward the carrier 34 and out of the carrier 34.

During the operation of the double-sided emissive organic display device 10, by means of the control element layer structure 40, a suitable voltage can be applied to the transparent second electrode 72 and the specularly reflective first electrode 54 of the second red OLED 24, for example. In response thereto, the organic functional layer structure 60, e.g. the first emitter layer 62, of the second red OLED 24 emits red light. The red light is emitted firstly in directions toward the carrier 34 and in a direction away from the carrier 34, that is to say in a direction toward the covering body 86. On account of the specularly reflective first electrode 54, however, that proportion of the red light which is emitted toward the carrier 34 is reflected in a direction toward the covering body 86, such that only red light 96 is emitted from the second red OLED 24 in a direction toward the covering body 86 and out of the covering body 86.

The embodiments and modes of functioning of the organic display device 10 illustrated with reference to the red OLEDs 14, 24 can readily be applied to the blue and green OLEDs 16, 18, 26, 28.

Figure 6:
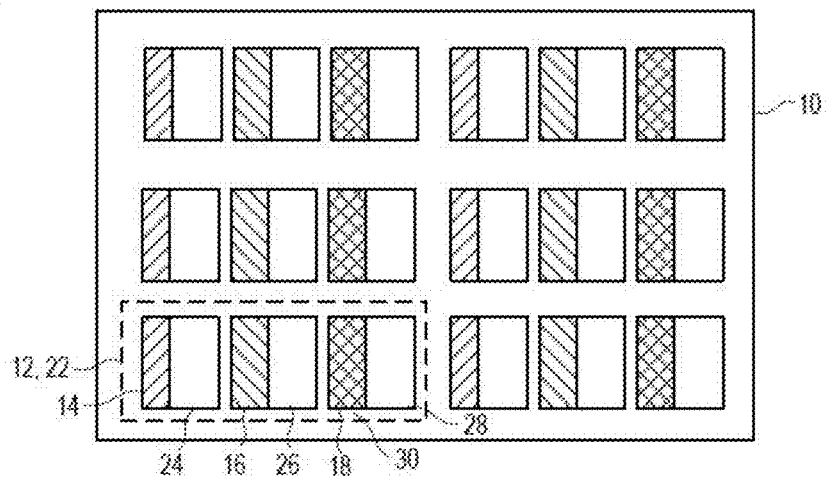
FIG. 6 shows a plan view of one embodiment of a double-sided emissive organic display device.

FIG. 6 shows a plan view of one embodiment of a double-sided emissive organic display device 10, which can for example largely correspond according to the organic display device 10 explained with reference to FIG. 3. The second OLEDs 24, 26, 28 are formed and arranged with respect to the first OLEDs 14, 16, 18 such that in each case one of the first OLEDs 14, 16, 28 forms a lateral overlap region 30 (see FIG. 7) with one of the second OLEDs 24, 26, 28. To put it another way, the second OLEDs 24, 26, 28 are formed and arranged with respect to the first OLEDs 14, 16, 18 such that they are arranged at least partly behind the first OLEDs 14, 16, 18 in the plan view shown in FIG. 6. Optionally, the second OLEDs 24, 26, 28 are made larger than the first OLEDs 14, 16, 18 in regard to their area.

Figure 7:
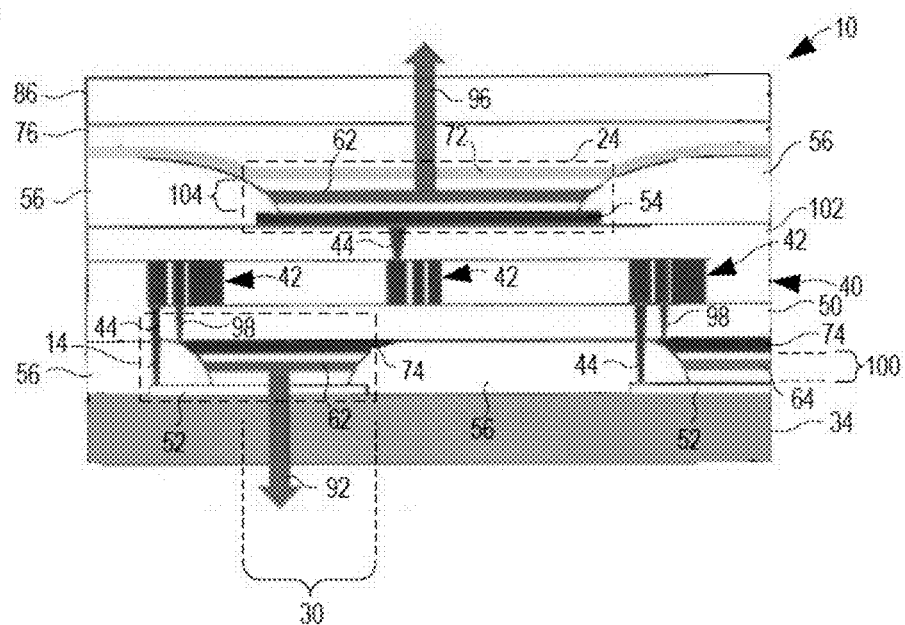
FIG. 7 shows a sectional illustration of one embodiment of the double-sided emissive organic display device in accordance with FIG. 6.

FIG. 7 shows a sectional illustration of one embodiment of the double-sided emissive organic display device in accordance with FIG. 6, which can for example largely correspond to the organic display device 10 shown in FIG.

5 and/or FIG. 6, wherein the first OLEDs 12 are arranged between the carrier 34 and the control element layer structure 40. The organic display device 10 therefore includes a first organic functional layer structure 100 between the carrier 34 and the control element layer structure 40 and a second organic functional layer structure 104 between the control element layer structure 40 and the covering body 86. Optionally, a further planarization layer 102 is formed between the control element layer structure 40 and the second OLEDs 24, 26, 28.

The embodiments and modes of functioning of the organic display device 10 illustrated with reference to the red OLEDs 14, 24 can readily be applied to the blue and green OLEDs 16, 18, 26, 28.

The rest of the construction and the mode of functioning of the organic display device 10 can for example largely correspond to the organic display device 10 explained with reference to FIG. 5. As an alternative thereto, the rest of the construction and the mode of functioning of the organic display device 10 can for example largely correspond to the organic display device 10 explained with reference to FIG. 4; for example, the first and/or the second organic functional layer structure 100, 104 can in each case be formed such that they extend over a plurality of the first and/or second OLEDs 14, 16, 18, 24, 26, 28, for example at least over the first and/or second OLEDs 14, 16, 18, 24, 26, 28 of one of the first and/or the second pixels 12, 22, for example at least over the first and/or second pixels 12, 22 of a module, for example over all first and/or second OLEDs 14, 16, 18, 24, 26, 28 of the organic display device 10. Furthermore, OLEDs 14, 16, 18, 24, 26, 28 which overlap in a lateral direction can be formed above the control element layer structure 40. Furthermore, the OLEDs 14, 16, 18, 24, 26, 28 explained with reference to the previous figures can have areas of different sizes.

Figure 8:
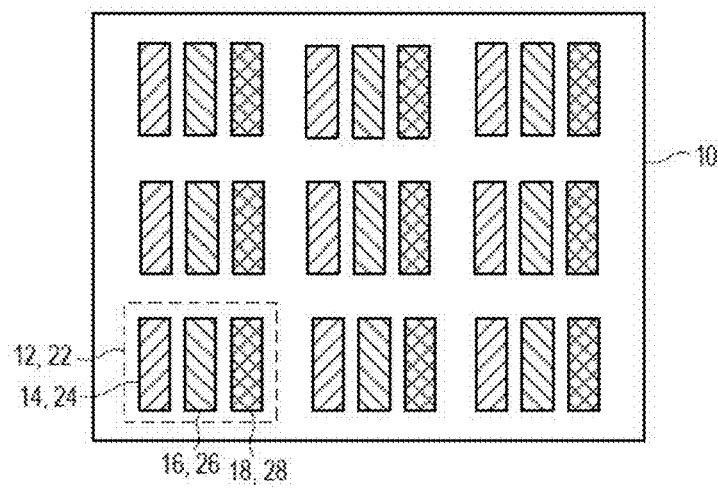
FIG. 8 shows a plan view of one embodiment of a double-sided emissive organic display device.

FIG. 8 shows a plan view of one embodiment of a double-sided emissive organic display device 10, which can for example largely correspond, e.g. in regard to the plan view illustrated, to the organic display device 10 explained with reference to FIG. 2. The second pixels 22 are formed below the first pixels 12. By way of example, a respective second pixel 22 is formed below each first pixel 12. To put it another way, pairs of one of the first and one of the second pixels 12, 22 form a respective lateral overlap region, wherein the corresponding pixels 12, 22 completely overlap one another.

Figure 9:
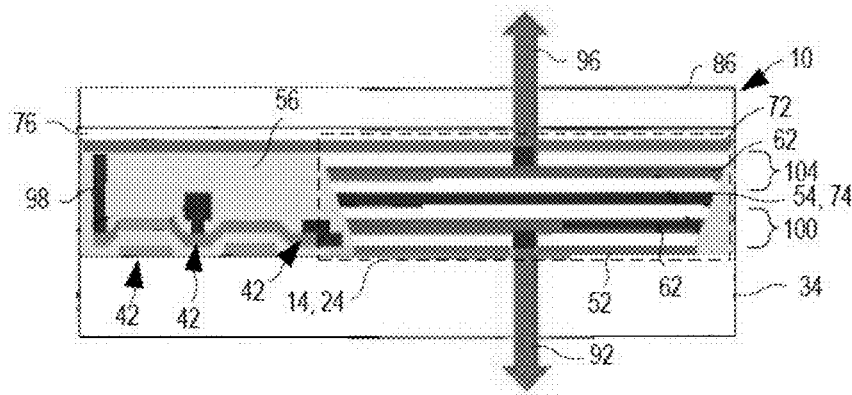
FIG. 9 shows a sectional illustration of one embodiment of the double-sided emissive organic display device in accordance with FIG. 8.

FIG. 9 shows a sectional illustration of one embodiment of the double-sided emissive organic display device 10 in accordance with FIG. 8, in which the pixels 12, 22 are arranged laterally alongside one another. In various embodiments, the control element layer structure 40 is formed in accordance with a lattice shape (not illustrated in the figures) in plan view, wherein the electronic components 42 and the insulation elements 56 form rows and columns of the lattice shape and the OLEDs 14, 16, 18, 24, 26, 28 are arranged in cutouts between the rows and the columns. The specularly reflective first and second electrodes 54, 74 are formed by a common electrode in each case.

The rest of the construction and the mode of functioning of the organic display device 10, e.g. of the first and second pixels 12, 22, can for example largely correspond to the organic display device 10 explained with reference to FIG. 5.

Figure 10:
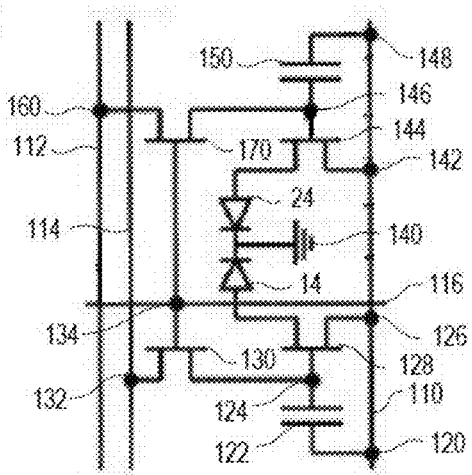
FIG. 10 shows a circuit diagram of two pixels of the double-sided emissive display device in accordance with FIG. 9.

FIG. 10 shows a circuit diagram of two pixels 12, 22, in particular of a pair of two pixels 12, 22, of the double-sided emissive display device 10 in accordance with FIG. 9.

The organic display device 10 includes a first signal line 112, a second signal line 114, a sense line 116 and an energy feed line 110. The energy feed line 110 has a first node 120, a second node 126, a third node 142 and a fourth node 148. The second signal line 114 has a fifth node 132 and the first signal line has a sixth node 160. The sense line has a seventh node 134.

A first capacitor 122 is connected to the first node 120 on one side and to an eighth node 124 on the other side. A first transistor 128 is connected to the second node 126, the eighth node 124 and, for example, the first red OLED 14, e.g. to one of its electrodes 52, 74. In various embodiments, in the case of the first transistor 128, the source is connected to the second node 126, the drain is connected to the red OLED 14 and the base is connected to the eighth node 124. A second transistor 130 is connected to the eighth node 124, the fifth node 132 and the seventh node 134. In various embodiments, in the case of the second transistor 130, the source is connected to the fifth node 132, the drain is connected to the eighth node 124 and the base is connected to the seventh node 134. A third transistor 144 is connected to the third node 142, for example the second red OLED 24, e.g. to one of its electrodes 54, 72, and to a ninth node 146. In various embodiments, in the case of the third transistor 144, the source is connected to the third node 142, the drain is connected to the red OLED 24 and the base is connected to the ninth node 146. A fourth transistor 170 is connected to the ninth node 146, the sixth node 160 and the seventh node 134. In various embodiments, in the case of the fourth transistor 170, the source is connected to the sixth node 160, the drain is connected to the ninth node 146 and the base is connected to the seventh node 134. A second capacitor 150 is connected to the ninth node 146 on one side and to the fourth node 148 on the other side. Both red OLEDs 14, 24, e.g. one of their electrodes 52, 54, 72, 74, are connected to ground or are at a common predefined potential.

In this way, the first and second OLEDs 14, 16, 18, 24, 26, 28 can be driven and/or operated in each case in pairs with only one common sense line 116. As an alternative thereto, the first and second OLEDs 14, 16, 18, 24, 26, 28 can be driven and/or operated in a similar manner in each case in pairs with only one common signal line 112, 114.

FIG. 11 shows a flow diagram of one embodiment of a method for producing a double-sided emissive organic display device, for example one of the double-sided emissive organic display devices 10 explained above with reference to FIG. 4 or FIG. 5.

In a step S2, a carrier is provided, for example the carrier 34. The carrier 34 can be provided, for example, by the carrier 34 being loaded into a device for producing the double-sided emissive display device 10, for example into a device for forming and/or depositing one or a plurality of layers.

In an optional step S4, a color filter layer can be formed; for example, the first color filter layer 36 can be formed above the carrier 34, for example if the organic display device 10 in accordance with FIG. 4 is produced and/or if the organic functional layer structure 60 of the double-sided emissive organic display device 10 is formed such that it generates white light. The color filters 38, 39 of the first color filter layer 36 can be deposited, for example, e.g. deposited in a structured fashion.

In a step S6, a control element layer structure is formed; for example, the control element layer structure 40 is formed above the carrier 34 and, if appropriate, above the first color filter layer 36. In particular the electronic components 42 of the control element layer structure 40 can be formed. Forming the control element layer structure 40 may include depositing and/or structuring the electronic components 42. As an alternative thereto, the first color filter layer 36 can be formed after and above the control element layer structure 40.

In a step S8, a passivation layer is formed; for example the passivation layer 50 above the first electrodes 52, 54. The passivation layer 50 serves for providing a planar area for forming the organic functional layer structure 60 and/or for electrically insulating the first electrodes 52, 54 from the organic functional layer structure 60. In addition, the first plated-through holes 44 can be formed in step S12.

In a step S10, transparent first electrodes are formed; for example, the transparent first electrodes 52 are formed above the control element layer structure 40. The transparent first electrodes 52 are elements of the first pixels 12. The transparent first electrodes 52 can be deposited and/or structured, for example.

In a step S12, specularly reflective first electrodes are formed; for example, the specularly reflective first electrodes 54 are formed above the control element layer structure 40. The specularly reflective first electrodes 54 are elements of the second pixels 22. The specularly reflective first electrodes 54 can be deposited and/or structured, for example. Alternatively, the specularly reflective first electrodes 54 can be formed before or at the same time as the transparent electrodes 52. Furthermore, the first electrodes 52, 54 can be formed before the control element layer structure 40 and the control element layer structure 40 can be formed above the first electrodes 52, 54.

In a step S13, insulation elements are formed; for example, the insulation elements 56 are formed above the control element layer structure 40 and/or at least partially above the first electrodes 52, 54. The insulation elements 56 serve for electrically insulating the first electrodes 52, 54 from one another. The insulation elements 56 can be printed, deposited and/or structured, for example. As an alternative thereto, the insulation elements 56 can be formed before the first transparent and/or specularly reflective electrodes 52, 54. Furthermore, the second plated-through holes 98 can be formed in step S13.

Steps S4 to S13 explained above can be processed at least partly in a different order. The product produced after these steps can also be referred to as a substrate, e.g. as a substrate for forming the organic functional layer structure 60.

In a step S14, an organic functional layer structure is formed, for example one of the organic functional layer structures 60 explained above; for example, for all pixels 12, 22 continuous emitter layers 62, 64, 66 are formed or for each pixel 12, 22 in each case one, two or three of the emitter layers 62, 64, 66 are formed above the first electrodes 52, 54 and above the insulation elements 56.

In a step S16, specularly reflective second electrodes are formed; for example, the specularly reflective second electrodes 74 are formed above the organic functional layer structure 60. The specularly reflective second electrodes 74 are elements of the first pixels 12. The specularly reflective second electrodes 74 can be deposited and/or structured, for example.

In a step S18, transparent second electrodes are formed; for example, the transparent second electrodes 72 are formed above the organic functional layer structure 60. The transparent second electrodes 72 are elements of the second pixels 22. The transparent second electrodes 72 can be deposited and/or structured, for example. Alternatively, the transparent second electrodes 72 can be formed before or at the same time as the specularly reflective second electrodes 74.

In a step S20, an encapsulation layer can be formed; for example, the encapsulation layer 76 can be formed above the second electrodes 72, 74.

In an optional step S22, an anti-scratch protective layer can be formed, for example above the encapsulation layer 76.

In an optional step S24, a color filter layer can be formed; for example, the second color filter layer 80 can be formed above the encapsulation layer 76 and, if appropriate, above the anti-scratch protective layer, for example if the organic display device 10 in accordance with FIG. 4 is produced and/or if the organic functional layer structure 60 of the organic display device 10 is formed such that it generates white light during operation. The color filters 82, 84 of the second color filter layer 80 can be deposited, for example, e.g. deposited in a structured fashion. Alternatively, the second color filter layer 80 can be formed between the organic functional layer structure 60 and the encapsulation layer 76 with regard to the layer sequence and/or with regard to the temporal order.

In a step S26, an encapsulation is formed. The encapsulation includes the covering body 86, for example. The encapsulation can furthermore include an adhesion medium layer, with the aid of which the covering body 86 is fixed to the encapsulation layer 76 and, if appropriate, to the second color filter layer 80.

If the production steps described above were processed on a carrier 34 which extends over a plurality of modules and the modules are intended to be singulated before further processing, then the modules can be singulated in a step S28. After, the organic display device 10 can be assembled from the modules.

In an optional step S30, the modules can be connected to one another, to driver units and/or control units or the like, can be integrated into the organic display device 10 and/or can be tested. As an alternative thereto, depending on the design of the modules, it is possible to test the modules while still in the assemblage, that is to say before singulation.

FIG. 12 shows a flow diagram of one embodiment of a method for producing a double-sided emissive display device, for example the organic display device 10 explained above with reference to FIG. 7.

In a step S40, a carrier is provided, for example the carrier 34. The carrier 34 can be provided, for example, by the carrier 34 being loaded into a device for producing the double-sided emissive display device 10, for example into a device for forming and/or depositing one or a plurality of layers.

In an optional step S42, a color filter layer can be formed; for example, the first color filter layer 36 can be formed above the carrier 34, for example if the first organic functional layer structure 100 of the organic display device 10 is formed such that it generates white light. The color filters 38, 39 of the first color filter layer 36 can be deposited, for example, in particular deposited in a structured fashion.

In a step S44, transparent first electrodes are formed; for example, the transparent first electrodes 52 are formed above the carrier 34 and, if appropriate, above the first color filter layer 36. As an alternative thereto, the transparent first electrodes 52 can be formed between the carrier 34 and the first color filter layer 36. The transparent first electrodes 52 are elements of the first pixels 12. The transparent first electrodes 52 can be deposited and/or structured, for example.

In a step S46, a first organic functional layer structure is formed, for example the first organic functional layer structure 100 explained above; for example, for the first OLEDs 14, 16, 18 the corresponding emitter layers 62, 64, 66, are formed above the transparent first electrodes 52.

In a step S48, specularly reflective second electrodes are formed; for example the specularly reflective second electrodes 74 are formed above the organic functional layer structure 60. The specularly reflective second electrodes 74 are elements of the first pixels 12. The specularly reflective second electrodes 74 can be deposited and/or structured, for example. Optionally, the planarization layer 50 can be formed above the specularly reflective second electrodes 74, for example for the purpose of electrically insulating the specularly reflective second electrodes 74. Furthermore, the plated-through holes 44, 98 can be formed.

In a step S50, a control element layer structure is formed; for example, the control element layer structure 40 is formed firstly independently of the production explained above and in particular firstly not above the carrier 34 and above the first pixels 12. Forming the control element layer structure 40 may include depositing and/or structuring the electronic components 42.

In a step S52, the control element layer structure 40 can be arranged above the first OLEDs 24, 26, 28 and can be fixed to the first OLEDs 24, 26, 28, for example by means of an adhesion medium. Furthermore, the transparent first electrodes 52 and the specularly reflective second electrodes 74 can be connected to the control element layer structure 40, e.g. by means of the plated-through holes 44, 98.

In an optional step S54, a passivation layer can be formed; for example, the further passivation layer 102 can be formed above the control element layer structure 40. The further passivation layer 102 serves for electrically insulating the control element layer structure 40. In addition, in step S54, further plated-through holes 44, 98 for electrically contacting the second OLEDs 24, 26, 28 can be formed.

In a step S56, specularly reflective first electrodes are formed; for example, the specularly reflective first electrodes 54 are formed above the control element layer structure 40 and, if appropriate, above the further passivation layer 102. The specularly reflective first electrodes 54 are elements of the second pixels 22, e.g. of the second OLEDs 24, 26, 28. The specularly reflective first electrodes 54 can be deposited and/or structured, for example. Furthermore, the insulation elements 56 can be formed above the control element layer structure 40 and, if appropriate, above the further passivation layer 102 and/or at least partly above the specularly reflective first electrodes 54. The insulation elements 56 serve for electrically insulating the specularly reflective first electrodes 54 from one another. The insulation elements 56 can be printed, deposited and/or structured, for example. As an alternative thereto, the insulation elements 56 can be formed before the specularly reflective first electrodes 54.

In a step S58, a second organic functional layer structure is formed, for example the second organic functional layer structure 104 explained above; for example, for the second OLEDs 24, 26, 28 the corresponding emitter layers 62, 64, 66, are formed above the specularly reflective first electrodes 54.

In a step S60, transparent second electrodes are formed; for example, the transparent second electrodes 72 are formed above the second organic functional layer structure 104. The transparent second electrodes 72 are elements of the second pixels 22 and in particular of the second OLEDs 24, 26, 28. The transparent second electrodes 72 can be deposited and/or structured, for example.

In a step S62, an encapsulation layer can be formed; for example, the encapsulation layer 76 can be formed above the transparent second electrodes 72.

In an optional step S64, an anti-scratch protective layer can be formed, for example above the encapsulation layer 76.

In an optional step S66, a color filter layer can be formed; for example, the second color filter layer 80 can be formed above the encapsulation layer 76 and, if appropriate, above the anti-scratch protective layer, for example if the second organic functional layer structure 104 is formed such that it generates white light during operation. The color filters 82, 84 of the second color filter layer 80 can be deposited, for example, e.g. deposited in a structured fashion. Alternatively, the second color filter layer 80 can be formed between the second organic functional layer structure 104 and the encapsulation layer 76 with regard to the layer sequence and/or with regard to the temporal order.

In a step S68, an encapsulation is formed. The encapsulation includes the covering body 86, for example. The encapsulation can furthermore include an adhesion medium layer, with the aid of which the covering body 86 is fixed to the encapsulation layer 76 and, if appropriate, to the second color filter layer 80.

If the production steps described above were processed on a carrier 34 which extends over a plurality of modules and the modules are intended to be singulated before further processing, then the modules can be singulated in a step S70. After, the organic display device 10 can be assembled from the modules.

In an optional step S72, the modules can be connected to one another, to driver units and/or control units or the like, can be integrated into the organic display device 10 and/or can be tested. As an alternative thereto, depending on the design of the modules, it is possible to test the modules while still in the assemblage, that is to say before singulation.

The invention is not restricted to the embodiment s indicated. By way of example, the embodiment s can be combined with one another. In various embodiments, independently of the layer sequence of first OLEDs 14, 16, 18, second OLEDs 24, 26, 28 and control element layer structure 40, the OLEDs 14, 16, 18, 24, 26, 28 can be formed such that they emit white light, e.g. mixed from single-colored light, and are combined with corresponding color filters or that they emit single-colored light and the color filters are dispensed with. Furthermore, if color filters are formed, they can be formed in different layers. Furthermore, the control element layer structure 40 illustrated with only one layer in the figures can be constructed from a plurality of individual and/or partial layers. Furthermore, the organic display device 10 and/or a module of the organic display device 10 may include far more than the pixels 12, 22 illustrated. Furthermore, in all embodiment s the subpixels of the individual pixels 12, 22 can be formed in the column direction. Furthermore, the pixels 12, 22 and/or the subpixels can be offset with respect to one another in the column direction as an alternative or in addition to the offset in the line direction. Furthermore, the subpixels of a color for the individual pixels 12, 22 can be embodied doubly in each case. To put it another way, the individual pixels 12, 22 can in each case include two subpixels which emit light of the same color during operation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A double-sided emissive organic display device, comprising:
a single carrier;
a plurality of first organic light emitting components form first pixels, which are formed above the single carrier, which are electrically connected to a single control element layer and which are driven by the single control element layer during the operation of the double-sided emissive organic display device and emit first light substantially in a direction toward the single carrier;
the single control element layer above the plurality of first organic light emitting components; and
a plurality of second organic light emitting components form second pixels, which are formed above the single control element layer and which are electrically connected to the single control element layer and which are driven by the single control element layer during the operation of the double-sided emissive organic display device and emit second light substantially in a direction away from the single carrier,
wherein each of the first and second organic light emitting components includes, a first electrode, an organic functional layer structure above the first electrode, and
a second electrode above the organic functional layer structure, and
wherein the control element layer structure includes at least one active component;
wherein the first pixels and the second pixels are formed such that they form a lateral overlap region and the second pixels are larger in area than the first pixels.

2. The double-sided emissive organic display device of claim 1,
wherein the first organic light emitting components are formed in a manner offset with respect to the second organic light emitting components in a vertical direction.

3. The double-sided emissive organic display device of claim 1,
wherein the first pixels are formed by in each case at least two adjacent first organic light emitting components, and wherein the second pixels are formed by in each case at least two adjacent second organic light emitting components.

4. The double-sided emissive organic display device of claim 1,
wherein the first organic light emitting components of one of the first pixels are formed in a manner offset with respect to the second organic light emitting components of one of the second pixels, which forms a lateral overlap region with the corresponding first pixel in a lateral direction in such a way that in each case one of the first organic light emitting components of the corresponding first pixel forms a lateral overlap region with one of the second organic light emitting components of the corresponding second pixel.

5. The double-sided emissive organic display device of claim 1,
wherein the individual first organic light emitting components in each case have a different size than the individual second organic light emitting components in a lateral direction.

6. The double-sided emissive organic display device of claim 1,
wherein the single control element layer comprises a plurality of sense lines and a plurality of signal lines, which intersect one another and which are electrically connected to the first organic light emitting components and to the second organic light emitting components for the purpose of driving the pixels, wherein the sense lines or the signal lines are electrically connected in each case to a plurality of the first organic light emitting components and to a plurality of the second organic light emitting components, such that the first organic light emitting components and second organic light emitting components connected to one of the sense lines or to one of the signal lines are drivable by means of the same corresponding sense line or signal line.

* * * * *